(12) United States Patent
Choi et al.

(10) Patent No.: US 10,998,057 B2
(45) Date of Patent: May 4, 2021

(54) STORAGE DEVICE AND METHOD OF OPERATING THE SAME

(71) Applicant: SK hynix Inc., Icheon-si (KR)

(72) Inventors: Won Jae Choi, Icheon-si (KR); Jea Won Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/846,985

(22) Filed: Apr. 13, 2020

(65) Prior Publication Data

US 2021/0065819 A1    Mar. 4, 2021

(30) Foreign Application Priority Data

Sep. 3, 2019    (KR) .......................... 10-2019-0109109

(51) Int. Cl.
| | |
|---|---|
| *G11C 16/26* | (2006.01) |
| *G11C 16/08* | (2006.01) |
| *G11C 16/12* | (2006.01) |
| *G11C 29/42* | (2006.01) |
| *G11C 29/44* | (2006.01) |
| *G11C 29/50* | (2006.01) |
| *G11C 7/10* | (2006.01) |
| *G11C 29/02* | (2006.01) |

(52) U.S. Cl.
CPC ............ *G11C 16/26* (2013.01); *G11C 7/1036* (2013.01); *G11C 16/08* (2013.01); *G11C 16/12* (2013.01); *G11C 29/42* (2013.01); *G11C 29/44* (2013.01); *G11C 29/50004* (2013.01); *G11C 29/021* (2013.01)

(58) Field of Classification Search
CPC ......... G11C 16/26; G11C 16/08; G11C 16/12; G11C 7/1036; G11C 29/42; G11C 29/44; G11C 29/50004; G11C 29/021
See application file for complete search history.

(56) References Cited

U.S. PATENT DOCUMENTS

| | | | | |
|---|---|---|---|---|
| 8,072,805 B2 * | 12/2011 | Chou | ..................... | G11C 16/34 365/185.03 |
| 9,330,775 B2 * | 5/2016 | Kim | ........................ | G11C 16/28 |
| 10,090,046 B2 * | 10/2018 | Park | ........................ | G11C 16/28 |
| 10,559,362 B2 * | 2/2020 | Shin | ..................... | G11C 11/5642 |

FOREIGN PATENT DOCUMENTS

| | | | |
|---|---|---|---|
| KR | 1020140072697 A | | 6/2014 |
| KR | 101904209 B1 | | 10/2018 |

* cited by examiner

*Primary Examiner* — Vanthu T Nguyen
(74) *Attorney, Agent, or Firm* — William Park & Associates Ltd.

(57) ABSTRACT

A memory device includes a memory cell array, a read operator, a shift level determiner, and a read operation controller. The read operator applies a read voltage to a selected word line coupled to selected memory cells and reads the selected memory cells in response to an evaluation signal. The shift level determiner calculates a shift value indicating a difference between a number of memory cells read as on-cells and a reference number, and determines a shift level of a threshold voltage distribution for the selected memory cells. The soft read table storage stores soft read set parameters. The read operation controller determines a plurality of soft read voltages based on the shift level and the soft read set parameters and controls the read operator in response to the evaluation signal.

20 Claims, 13 Drawing Sheets

| SHIFT LEVEL | SHIFT VALUE (x) |
|---|---|
| S_L1 | Ref1≤x<Ref2 |
| S_L2 | Ref2≤x<Ref3 |
| S_L3 | Ref3≤x<Ref4 |

| SHIFT LEVEL | INTERVAL BETWEEN SOFT READ VOLTAGES |
|---|---|
| S_L1 | N1 |
| S_L2 | N2 |
| S_L3 | N3 |

STORAGE DEVICE AND METHOD OF OPERATING THE SAME

CROSS-REFERENCE TO RELATED APPLICATION

The present application claims priority under 35 U.S.C. § 119(a) to Korean patent application number 10-2019-0109109 filed on Sep. 3, 2019, the entire disclosure of which is incorporated herein by reference.

BACKGROUND

1. Technical Field

Various embodiments of the present disclosure generally relate to an electronic device, and more particularly, to a storage device and a method of operating the storage device.

2. Related Art

A storage device is a device which stores data under the control of a host device, such as a computer or a smartphone. The storage device may include a memory device in which data is stored and a memory controller which controls the memory device. Such memory devices are classified as volatile memory devices and nonvolatile memory devices.

A volatile memory device is a memory device in which data is stored only when power is supplied and in which stored data is lost when the supply of power is interrupted. Examples of volatile memory devices include a Static Random Access Memory (SRAM) and Dynamic Random Access Memory (DRAM).

A nonvolatile memory device is a memory device in which stored data is retained even when the supply of power is interrupted. Examples of nonvolatile memory devices include a Read Only Memory (ROM), a Programmable ROM (PROM), an Electrically Programmable ROM (EPROM), an Electrically Erasable and Programmable ROM (EEPROM), and a flash memory.

SUMMARY

A memory device in accordance with an embodiment may include a memory cell array, a read operator, a shift level determiner, and a read operation controller. The memory cell array may include a plurality of memory cells. The read operator may be configured to apply a read voltage to a selected word line coupled to memory cells selected from among the plurality of memory cells and configured to read the selected memory cells in response to an evaluation signal for sensing data stored in the selected memory cells. The shift level determiner may be configured to calculate a shift value indicating a difference between a number of memory cells that are read as on-cells using the read voltage, among the selected memory cells, and a reference number of memory cells, and configured to determine a shift level of a threshold voltage distribution for the selected memory cells based on the shift value. The soft read table storage may be configured to store soft read set parameters respectively corresponding to a plurality of shift levels. The read operation controller may be configured to determine a plurality of soft read voltages based on the shift level and the soft read set parameters and configured to control the read operator in response to the evaluation signal so that a soft read operation of reading the selected memory cells using the plurality of determined soft read voltages is performed.

A storage device in accordance with an embodiment may include a memory device including a plurality of memory cells, and a memory controller configured to, when a read operation of reading memory cells selected from among the plurality of memory cells using a read voltage fails, calculate a shift value indicating a difference between a number of memory cells read as on-cells using the read voltage, among the selected memory cells, and a reference number of memory cells, and configured to provide the memory device with the shift value and a soft read command of indicating a soft read operation for the selected memory cells. The memory device may be configured to determine a shift level of a threshold voltage distribution for the selected memory cells based on the shift value in response to the soft read command and configured to perform the soft read operation of reading the selected memory cells using a plurality of soft read voltages determined based on the shift level.

DETAILED DESCRIPTION

Specific structural or functional descriptions in embodiments of the present disclosure introduced in this specification or application are only for description of the embodiments of the present disclosure. The descriptions should not be construed as being limited to the embodiments described in the specification or application.

Hereinafter, embodiments of the present disclosure are described in detail with reference to the accompanying drawings. Hereinafter, an embodiment of the present disclosure is described in detail with reference to the attached drawings.

Various embodiments of the present disclosure are directed to a storage device having improved read performance and a method of operating the storage device.

Figure 1:
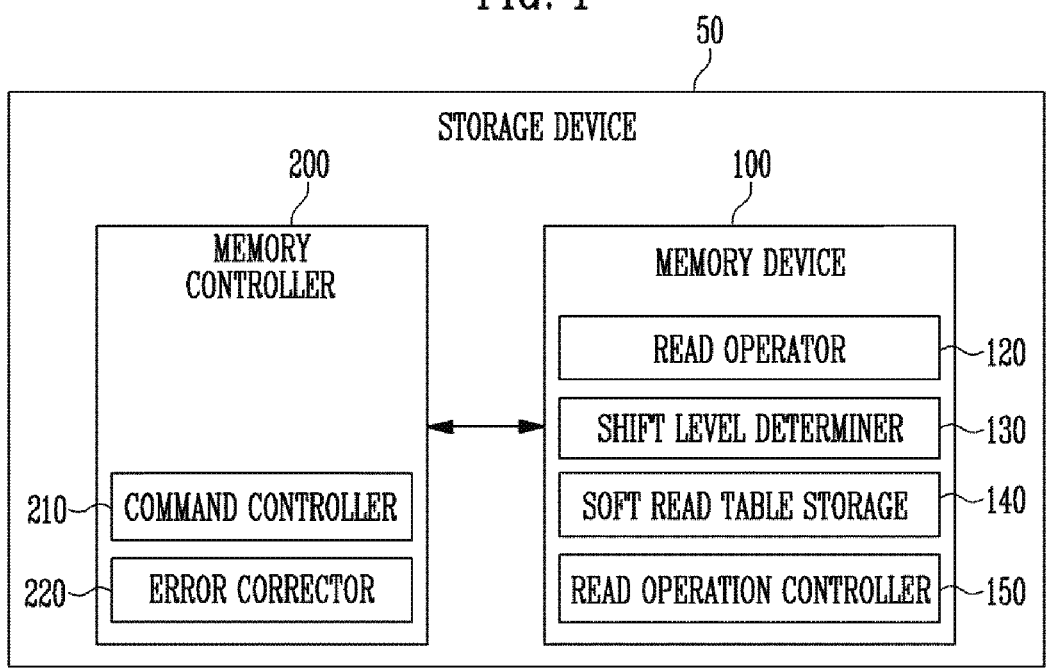
FIG. 1 is a diagram illustrating a storage device according to an embodiment of the present disclosure.

FIG. 1 is a diagram illustrating a storage device according to an embodiment of the present disclosure.

Referring to FIG. 1, a storage device 50 may include one or more memory devices 100 and a memory controller 200. The storage device 50 may be a device which stores data under the control of a host, such as a mobile phone, a smartphone, an MP3 player, a laptop computer, a desktop computer, a game console, a television (TV), a tablet personal computer (PC), or an in-vehicle infotainment system.

The storage device 50 may be manufactured as any one of various types of storage devices depending on a host interface that is a scheme for communication with the host. The storage device 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal storage bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The storage device 50 may be manufactured in any one of various types of package forms. For example, the storage device 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

Each memory device 100 may store data. The memory device 100 is operated in response to the control of the memory controller 200. The memory device 100 may include a memory cell array including a plurality of memory cells which store data.

Each of the memory cells may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The memory cell array may include a plurality of memory blocks. Each memory block may include a plurality of memory cells. One memory block may include a plurality of pages. In an embodiment, each page may be a unit by which data is stored in the memory device 100 or by which data stored in the memory device 100 is read.

A memory block may be a unit by which data is erased. In an embodiment, the memory device 100 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (STT-RAM). In the present specification, for convenience of description, a description is made on the assumption that the memory device 100 is a NAND flash memory.

The memory device 100 may receive a command and an address from the memory controller 200, and may access the area of the memory cell array, selected by the address. That is, the memory device 100 may perform an operation indicated by the command on the area selected by the address. For example, the memory device 100 may perform a write operation (i.e., program operation), a read operation, and an erase operation. During a program operation, the memory device 100 may program data to the area selected by the address. During a read operation, the memory device 100 may read data from the area selected by the address. During an erase operation, the memory device 100 may erase data stored in the area selected by the address.

In an embodiment, the memory device 100 may include a read operator 120, a shift level determiner 130, a soft read table storage 140, and a read operation controller 150.

The read operator 120 may read memory cells selected from among a plurality of memory cells in a memory cell array. The read operator 120 may apply a read voltage to a word line coupled to the selected memory cells, and may read data stored in the selected memory cells in response to an evaluation signal. The evaluation signal may be a signal for sensing the data stored in the memory cells.

The shift level determiner 130 may calculate a shift value when a read operation is performed. The shift value may be the difference between the number of memory cells read as on-cells using a read voltage, among the selected memory cells, and the reference number of memory cells. The reference number of memory cells may be determined based on the number of selected memory cells and the number of data bits stored in the selected memory cells.

The shift level determiner 130 may determine a shift level based on the calculated shift value. In an embodiment, the shift level determiner 130 may determine the shift level based on the shift value provided from the memory controller 200.

In detail, the shift level determiner 130 may compare a plurality of reference values with the shift value, and may determine a period to which the shift value belongs, among a plurality of reference periods determined depending on the plurality of reference values. The shift level determiner 130 may determine the shift level corresponding to the period to which the shift value belongs, among a plurality of shift levels respectively corresponding to the plurality of reference periods.

The soft read table storage 140 may store soft read set parameters depending on the shift level. The soft read set parameters may include information about soft read voltages for the soft read operation.

For example, the soft read set parameters may include information about the interval between soft read voltages. The soft read set parameters may include information about the number of soft read voltages.

The read operation controller 150 may control the read operator 120 so that, when a read command is received, the read operator 120 performs a read operation.

The read operation controller 150 may determine the soft read voltages based on the shift level determined by the shift level determiner 130 and the soft read set parameters stored in the soft read table storage 140. The read operation controller 150 may control the evaluation signal so that the read operator 120 performs a soft read operation based on the determined soft read voltages.

In an embodiment, the read operation controller 150 may control the read operator 120 so that, when a soft read command is received, the read operator 120 performs a soft read operation.

In an embodiment, the read operation controller 150 may control the read operator 120 so that, when a read operation fails, the read operator 120 performs a soft read operation. The read operation controller 150 may acquire information, indicating whether the read operation has passed/failed, from a read fail detection circuit (not illustrated) of the memory device 100.

The memory controller 200 controls the overall operation of the storage device 50.

When power is applied to the storage device 50, the memory controller 200 may run firmware (FW). When the memory device 100 is a flash memory device, the memory controller 200 may run firmware such as a flash translation layer (FTL) for controlling communication between the host and the memory device 100.

In an embodiment, the memory controller 200 may receive data and a logical block address (LBA) from the host, and may translate the logical block address into a physical block address (PBA) indicating the address of memory cells which are included in the memory device 100 and in which data is to be stored.

The memory controller 200 may control the memory device 100 so that a program operation, a read operation, or an erase operation is performed in response to a request received from the host. During a program operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may autonomously generate a command, an address, and data regardless of a request from the host, and may transmit them to the memory device 100. For example, the memory controller 200 may provide commands, addresses, and data to the memory device 100 so as to perform background operations, such as a program operation for wear leveling and a program operation for garbage collection.

In an embodiment, the memory controller 200 may control at least two memory devices 100. In this case, the memory controller 200 may control the memory devices 100 depending on an interleaving scheme to improve operating performance. The interleaving scheme may be an operating manner in which the operating periods of the at least two memory devices 100 are caused to overlap each other.

In an embodiment, the memory controller 200 may include a command controller 210 and an error corrector 220.

The command controller 210 may provide a read command for performing a read operation on the selected memory cells to the memory device 100.

The command controller 210 may determine, based on the error correction decoding information provided by the error corrector 220, whether the read operation has failed. When the read operation fails, the command controller 210 may provide a soft read command for a soft read operation to the memory device 100. The soft read operation may be an operation of reading the selected memory cells using a plurality of soft read voltages.

In an embodiment, the soft read operation may be performed using the same read voltage as the read operation, and may be performed in such a way so as to control evaluation periods during which the evaluation signal is activated.

The error corrector 220 may acquire read data based on the read operation from the memory device 100. The error corrector 220 may perform error correction decoding on the read data. The error corrector 220 may generate error correction decoding information indicating whether the read operation has passed or failed. The error corrector 220 may provide the generated error correction decoding information to the command controller 210.

The error corrector 220 may acquire soft data based on a soft read operation from the memory device 100. The error corrector 220 may perform Low Density Parity Check (LDPC) decoding using the soft data. The error corrector 220 may correct an error in read data having failed in the read operation and recover the read data through LDPC decoding.

The host may communicate with the storage device 50 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
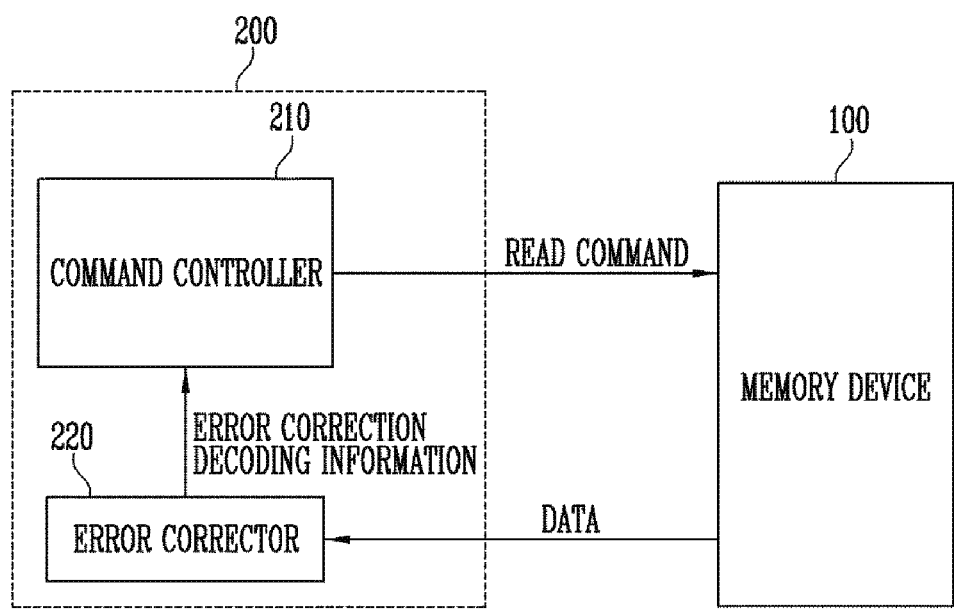
FIG. 2 is a diagram illustrating a structure of a memory controller of FIG. 1.

FIG. 2 is a diagram illustrating the structure of the memory controller 200 of FIG. 1.

Referring to FIG. 2, the memory controller 200 may include a command controller 210 and an error corrector 220.

The command controller 210 may provide a read command for performing a read operation on selected memory cells to a memory device 100. The read operation may be an operation of reading the selected memory cells using a read voltage.

The command controller 210 may determine, based on error correction decoding information provided by the error corrector 220, whether the read operation has failed. When the read operation fails, the command controller 210 may provide a soft read command for a soft read operation to the memory device 100. The soft read operation may be an operation of reading the selected memory cells using a plurality of soft read voltages.

In an embodiment, the command controller 210 may calculate a shift value based on the error correction decoding information. The shift value may be the difference between the number of memory cells read as on-cells using the read voltage, among the selected memory cells, and the reference number of memory cells. The reference number of memory cells may be determined based on the number of selected memory cells and the number of data bits stored in the selected memory cells.

In an embodiment, the command controller 210 may provide a soft read command, together with the shift value, to the memory device 100.

The error corrector 220 may acquire read data based on the read operation from the memory device 100. The error corrector 220 may perform error correction decoding on the read data. In an embodiment, examples of an error correction code may include a Bose-Chaudhuri-Hocquenghem (BCH) code, a Low Density Parity Check (LDPC) code, etc. Because the BCH code uses arithmetic decoding, the number of correctable bits may have a fixed value. Therefore, when the number of error bits is less than or equal to the number of correctable bits, the BCH code may correct all errors. When the number of error bits is greater than the number of correctable bits, the BCH code cannot correct errors. The LDPC code may have performance closely approaching Shannon limit in comparison with other ECCs. However, the LDPC has high complexity in a decoding process and has error floors in which a decrease in error occurrence rate is slowed in relatively high Signal-to-Noise Ratio (SNR) regions.

The error corrector 220 may generate error correction decoding information indicating whether the read operation has passed or failed.

For example, as a result of error correction decoding, when error correction decoding has passed, the read operation may indicate a 'pass'. When the error correction decoding has failed, the read operation may indicate a 'fail'. When the number of fail bits contained in the read data is greater than the number of bits correctable by the error corrector 220, error correction decoding may fail. When the number of fail bits contained in the read data is less than or equal to the number of bits correctable by the error corrector 220, error correction decoding may pass.

The number of fail bits may be the number of memory cells read as off-cells, among memory cells to be read as on-cells using the read voltage. The number of fail bits may be the number of memory cells read as on-cells, among memory cells to be read as off-cells using the read voltage.

The error corrector 220 may provide the generated error correction decoding information to the command controller 210.

The error corrector 220 may acquire soft data based on a soft read operation from the memory device 100. The error corrector 220 may perform Low Density Parity Check (LDPC) decoding using the soft data. The error corrector 220 may correct fail bits contained in the read data through LDPC decoding and recover the read data.

Figure 3:
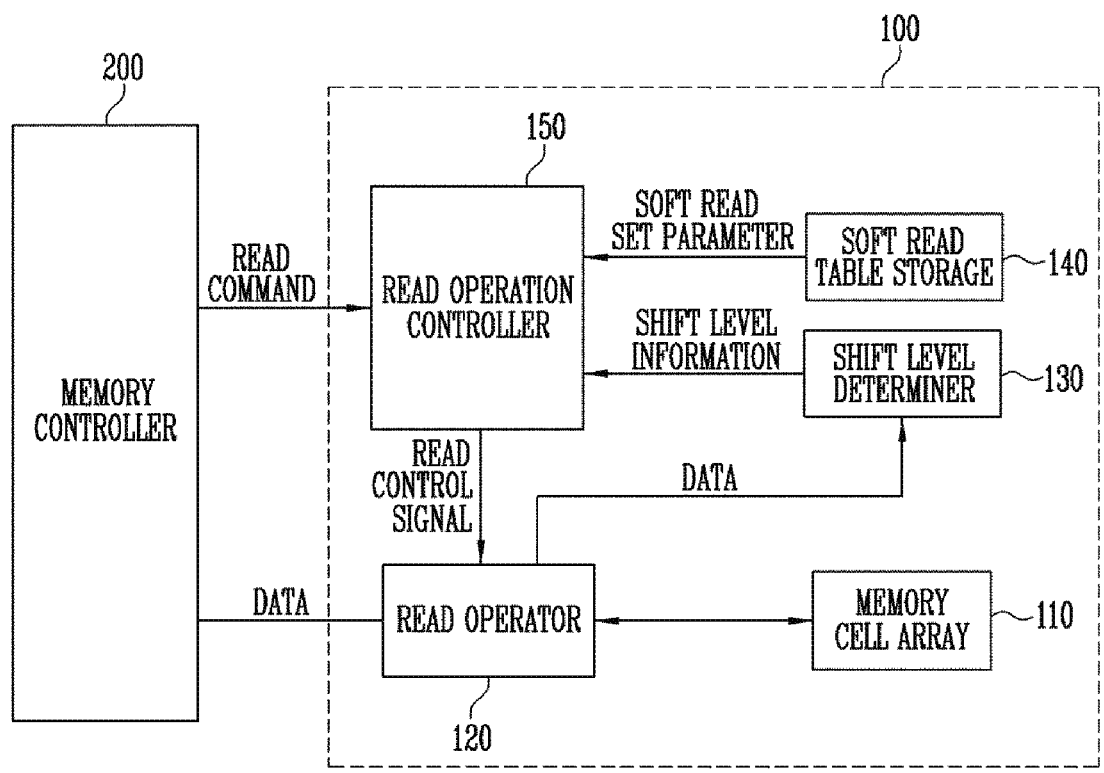
FIG. 3 is a diagram illustrating a structure of a memory device of FIG. 1.

FIG. 3 is a diagram illustrating the structure of the memory device 100 of FIG. 1.

Referring to FIG. 3, the memory device 100 may include a memory cell array 110, a read operator 120, a shift level determiner 130, a soft read table storage 140, and a read operation controller 150.

The read operator 120 may read memory cells selected from among a plurality of memory cells in the memory cell array 110.

In detail, the read operator 120 may apply a read voltage to a word line coupled to the selected memory cells and read the data stored in the selected memory cells in response to a read control signal. The read control signal may include an evaluation signal.

In an embodiment, the read operator 120 may apply the read voltage to the word line coupled to the selected memory cells, and may perform a soft read operation of reading the selected memory cells using a plurality of soft read voltages in response to evaluation periods in which the evaluation signal is activated. The soft read operation according to an embodiment of the present disclosure is described in detail later with reference to FIG. 6.

The read operator 120 may provide read data obtained by reading the selected memory cells using the read voltage to the shift level determiner 130 and the memory controller 200. The read operator 120 may apply a read voltage to the word line coupled to the selected memory cells, and may provide the memory controller 200 with soft data obtained by reading the selected memory cells using the plurality of soft read voltages.

The shift level determiner 130 may calculate a shift value based on the read data provided from the read operator 120. The shift value may be the difference between the number of memory cells read as on-cells using the read voltage, among the selected memory cells, and the reference number of memory cells. The reference number of memory cells may be determined based on the number of selected memory cells and the number of data bits stored in the selected memory cells.

The shift level determiner 130 may determine a shift level based on the calculated shift value. In an embodiment, the shift level determiner 130 may determine the shift level based on the shift value provided from the memory controller 200.

In detail, the shift level determiner 130 may compare a plurality of reference values with the shift value, and may determine a period to which the shift value belongs, among a plurality of reference periods determined depending on the plurality of reference values. The shift level determiner 130 may determine the shift level corresponding to the period to which the shift value belongs, among a plurality of shift levels respectively corresponding to the plurality of reference periods.

The shift level determiner 130 may provide the information about the determined shift level to the read operation controller 150.

The soft read table storage 140 may store soft read set parameters depending on the shift level. The soft read set parameters may include information about soft read voltages for the soft read operation.

The soft read set parameters may be stored in a system block of the memory cell array 110. The soft read set parameters stored in the system block may be uploaded to the soft read table storage 140 when the memory device 100 boots.

For example, the soft read set parameters may include information about the interval between soft read voltages depending on the shift level. The soft read set parameters may include information about the number of soft read voltages depending on the shift level.

In an embodiment, as the shift level becomes higher, the interval between the soft read voltages may increase. As the shift level becomes higher, the number of soft read voltages may increase.

The read operation controller 150 may provide the read control signal to the read operator 120 so that, when a read command is received, the read operator 120 performs a read operation. The read control signal may include the evaluation signal.

The read operation controller 150 may control the evaluation periods in which the evaluation signal is activated so that, when a soft read command is received, the read operator 120 performs a soft read operation.

The read operation controller 150 may determine soft read voltages based on the shift level information and the soft read set parameters.

For example, the read operation controller 150 may set the soft read voltages so that the number of soft read voltages corresponding to a second shift level higher than a first shift level is equal to or greater than the number of soft read voltages corresponding to the first shift level. For example, the read operation controller 150 may set the soft read voltages so that an interval between the soft read voltages corresponding to the second shift level is equal to or wider than an interval between the soft read voltages corresponding to the first shift level.

The read operation controller 150 may control the evaluation periods so that the read operator 120 performs a soft read operation based on the set soft read voltages.

In an embodiment, the read operation controller 150 may control the evaluation periods so that, when the read operation fails, the read operator 120 performs a soft read operation. The read operation controller 150 may acquire information, indicating whether the read operation has passed/ failed, from a read fail detection circuit (not illustrated) of the memory device 100. The read fail detection circuit may include a fail bit counter (FBC) or a current sensing circuit (CSC).

The read operation controller 150 may set the number of evaluation periods depending on the number of soft read voltages determined depending on the shift level.

In detail, the read operation controller 150 may set the number of evaluation periods so that the evaluation periods correspond to respective soft read voltages determined depending on the shift level. For example, the read operation controller 150 may increase the number of evaluation periods as the shift level becomes higher.

The read operation controller 150 may set the lengths of evaluation periods differently based on the interval between the soft read voltages determined depending on the shift level. For example, the read operation controller 150 may increase the difference between the lengths of the evaluation periods as the shift level becomes higher.

Figure 4:
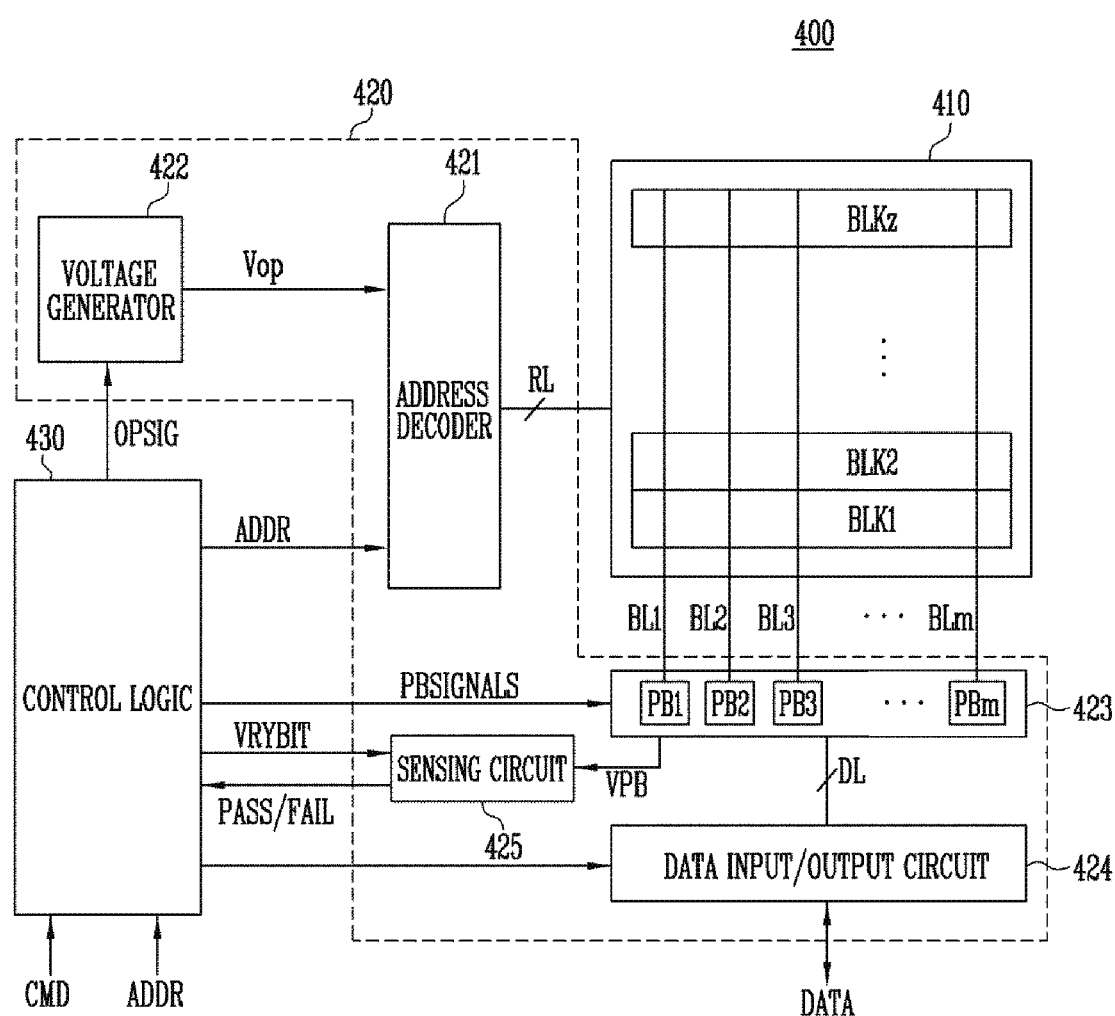
FIG. 4 is a diagram illustrating an embodiment of a memory device of FIG. 1.

FIG. 4 is a diagram illustrating a memory device 400. For an embodiment, the memory device 400 represents the memory device 100 of FIG. 1.

Referring to FIG. 4, the memory device 400 may include a memory cell array 410, a peripheral circuit 420, and a control logic 430.

The memory cell array 410 includes a plurality of memory blocks BLK1 to BLKz. The plurality of memory blocks BLK1 to BLKz are coupled to an address decoder 421 through row lines RL. The memory blocks BLK1 to BLKz may be coupled to a read and write circuit 423 through bit lines BL1 to BLm. Each of the memory blocks BLK1 to BLKz may include a plurality of memory cells. In an embodiment, the plurality of memory cells may be nonvolatile memory cells. Memory cells coupled to the same word line, among the plurality of memory cells, are defined as one physical page. In other words, the memory cell array 410 may include a plurality of physical pages. In an embodiment of the present disclosure, each of the memory blocks BLK1 to BLKz included in the memory cell array 410 may include a plurality of dummy cells. For the dummy cells, one or more dummy cells may be coupled in series between a drain select transistor and memory cells and between a source select transistor and memory cells.

Each of the memory cells of the memory device 400 may be implemented as a single-level cell (SLC) capable of storing one data bit, a multi-level cell (MLC) capable of storing two data bits, a triple-level cell (TLC) capable of storing three data bits, or a quad-level cell (QLC) capable of storing four data bits.

The peripheral circuit 420 may include the address decoder 421, a voltage generator 422, the read and write circuit 423, a data input/output circuit 424, and a sensing circuit 425.

The peripheral circuit 420 may drive the memory cell array 410. For example, the peripheral circuit 420 may drive the memory cell array 410 so as to perform a program operation, a read operation, and an erase operation.

The address decoder 421 is coupled to the memory cell array 410 through the row lines RL. The row lines RL may include drain select lines, word lines, source selection lines, and a common source line. In accordance with an embodiment of the present disclosure, the word lines may include normal word lines and dummy word lines.

The address decoder 421 may be operated under the control of the control logic 430. The address decoder 421 receives addresses ADDR from the control logic 430. The control logic 430 may be implemented as hardware, software, or a combination of hardware and software. For example, the control logic 430 may be a control logic circuit operating in accordance with an algorithm and/or a processor executing control logic code.

The address decoder 421 may decode a block address, among the received addresses ADDR. The address decoder 421 selects at least one of the memory blocks BLK1 to BLKz according to the decoded block address. The address decoder 421 may decode a row address, among the received addresses ADDR. The address decoder 421 may select at least one word line WL of the selected memory block by applying voltages supplied from the voltage generator 422 to the at least one word line WL according to the decoded row address.

During a program operation, the address decoder 421 may apply a program voltage to the selected word line and apply a pass voltage having a level lower than that of the program voltage to unselected word lines. During a program verify operation, the address decoder 421 may apply a verify voltage to a selected word line and apply a verify pass voltage having a level higher than that of the verify voltage to unselected word lines.

During a read operation, the address decoder 421 may apply a read voltage to a selected word line and apply a read pass voltage having a level higher than that of the read voltage to unselected word lines.

In accordance with an embodiment of the present disclosure, the erase operation of the memory device 400 is performed on a memory block basis. During the erase operation, the addresses ADDR input to the memory device 400 include a block address. The address decoder 421 may decode the block address and select one memory block according to the decoded block address. During the erase operation, the address decoder 421 may apply a ground voltage to word lines coupled to the selected memory block.

In accordance with an embodiment, the address decoder 421 may decode a column address, among the received addresses ADDR. The decoded column address may be transferred to the read and write circuit 423. In an embodiment, the address decoder 421 may include components such as a row decoder, a column decoder, and an address buffer.

The voltage generator 422 may generate a plurality of operating voltages Vop using an external supply voltage that is supplied to the memory device 400. The voltage generator 422 may be operated under the control of the control logic 430.

In an embodiment, the voltage generator 422 may generate an internal supply voltage by regulating the external supply voltage. The internal supply voltage generated by the voltage generator 422 is used as an operating voltage for the memory device 400.

In an embodiment, the voltage generator 422 may generate the plurality of operating voltages Vop using the external supply voltage or the internal supply voltage. The voltage generator 422 may generate various voltages required by the memory device 400. For example, the voltage generator 422 may generate a plurality of erase voltages, a plurality of program voltages, a plurality of pass voltages, a plurality of select read voltages, and a plurality of unselect read voltages.

The voltage generator 422 may include a plurality of pumping capacitors for receiving the internal supply voltage so as to generate a plurality of operating voltages Vop having various voltage levels, and may generate the plurality of operating voltages Vop by selectively enabling the plurality of pumping capacitors under the control of the control logic 430.

The generated operating voltages Vop may be supplied to the memory cell array 410 by the address decoder 421.

The read and write circuit 423 includes first to m-th page buffers PB1 to PBm. The first to m-th page buffers PB1 to PBm are coupled to the memory cell array 410 through the first to m-th bit lines BL1 to BLm, respectively. The first to m-th page buffers PB1 to PBm are operated under the control of the control logic 430.

The first to m-th page buffers PB1 to PBm may perform data communication with the data input/output circuit 424. During a program operation, the first to m-th page buffers PB1 to PBm receive data DATA to be stored through the data input/output circuit 424 and data lines DL.

During a program operation, the first to m-th page buffers PB1 to PBm may transfer the data DATA to be stored, received through the data input/output circuit 424, to selected memory cells through the bit lines BL1 to BLm when a program voltage is applied to a selected word line. The memory cells in the selected page are programmed based on the received data DATA. Memory cells coupled to a bit line to which a program permission voltage (e.g., a ground voltage) is applied may have increased threshold voltages. The threshold voltages of memory cells coupled to a bit line to which a program inhibit voltage (e.g., a supply voltage) is applied may be maintained. During a program verify operation, the first to m-th page buffers PB1 to PBm read the data DATA stored in the selected memory cells from the selected memory cells through the bit lines BL1 to BLm.

During a read operation, the read and write circuit 423 may read data DATA from the memory cells in the selected page through the bit lines BL, and may store the read data DATA in the first to m-th page buffers PB1 to PBm.

During an erase operation, the read and write circuit 423 may allow the bit lines BL to float. In an embodiment, the read and write circuit 423 may include a column select circuit.

In an embodiment, the read and write circuit 423 may include the plurality of page buffers PB coupled to the memory cells of the memory cell array 410 through the bit lines BL.

Read and write circuit control signals PBSIGNALS may include a plurality of page buffer control signals respectively corresponding to a plurality of page buffer groups. The plurality of page buffer groups may independently perform bit line precharge operations in response to the plurality of page buffer control signals corresponding thereto, respectively. The coupling relationships between the plurality of page buffer groups and the memory cells are described in detail later with reference to FIG. 9.

The data input/output circuit 424 is coupled to the first to m-th page buffers PB1 to PBm through the data lines DL. The data input/output circuit 424 is operated in response to the control of the control logic 430. The data input/output circuit 424 may include a plurality of input/output buffers (not illustrated) which receive input data DATA. During a program operation, the data input/output circuit 424 receives the data DATA to be stored from an external controller (not illustrated). During a read operation, the data input/output circuit 424 outputs the data DATA, received from the first to m-th page buffers PB1 to PBm included in the read and write circuit 423, to the external controller.

During a verify operation, the sensing circuit 425 may generate a reference current in response to an enable bit signal VRYBIT generated by the control logic 430, and may output a pass signal or a fail signal to the control logic 430 by comparing a sensing voltage VPB received from the read and write circuit 423 with a reference voltage generated by the reference current.

The control logic 430 may be coupled to the address decoder 421, the voltage generator 422, the read and write circuit 423, the data input/output circuit 424, and the sensing circuit 425. The control logic 430 may control the overall operation of the memory device 400. The control logic 430 may be operated in response to a command CMD transferred from an external device.

The control circuit 430 may control the peripheral circuit 420 by generating various types of signals in response to the command CMD and the addresses ADDR. For example, the control logic 430 may generate an operation signal OPSIG, the read and write circuit control signals PBSIGNALS, and the enable bit VRYBIT in response to the command CMD and the addresses ADDR. The control logic 430 may output the operation signal OPSIG to the voltage generator 422, output the address ADDR to the address decoder 421, output the read and write circuit control signals PBSIGNALS to the read and write circuit 423, and output the enable bit VRYBIT to the sensing circuit 425. In addition, the control logic 430 may determine whether a verify operation has passed or failed in response to the pass or fail signal PASS or FAIL output from the sensing circuit 425.

In an embodiment, the read operator of FIG. 1 may be included in the peripheral circuit 420. The shift level determiner, the soft read table storage, and the read operation controller of FIG. 1 may be included in the control logic 430.

Figure 5:
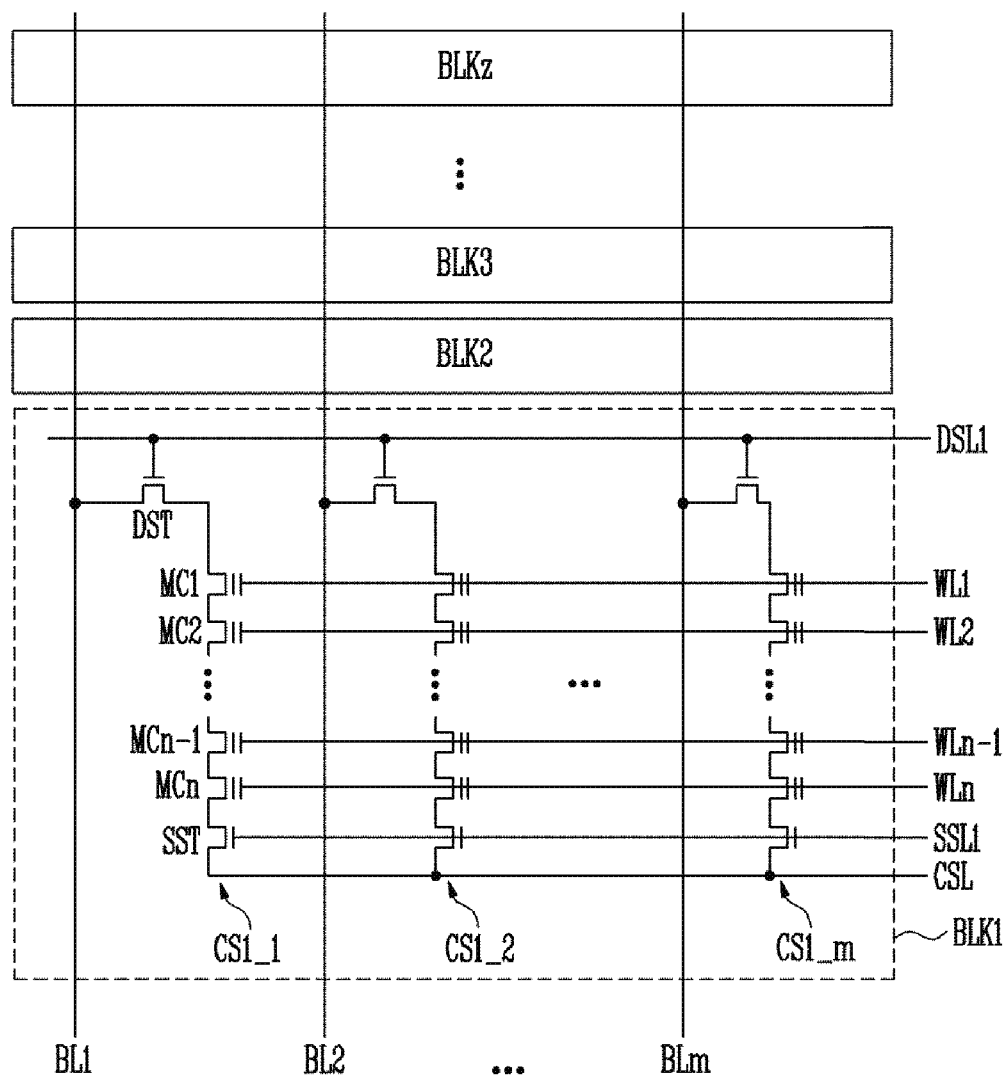
FIG. 5 is a diagram illustrating a memory cell array of FIG. 4.

FIG. 5 is a diagram illustrating the memory cell array 410 of FIG. 4.

Referring to FIG. 5, the first to z-th memory blocks BLK1 to BLKz are coupled in common to the first to m-th bit lines BL1 to BLm. In FIG. 5, for convenience of description, elements included in the first memory block BLK1, among the plurality of memory blocks BLK1 to BLKz, are illustrated, and illustration of elements included in each of the remaining memory blocks BLK2 to BLKz is omitted. It will be understood that each of the remaining memory blocks BLK2 to BLKz has the same configuration as the first memory block BLK1.

The memory block BLK1 may include a plurality of cell strings CS1_1 to CS1_m (where m is a positive integer). The first to m-th cell strings CS1_1 to CS1_m are respectively coupled to the first to m-th bit lines BL1 to BLm. Each of the first to m-th cell strings CS1_1 to CS1_m may include a drain select transistor DST, a plurality of memory cells MC1 to MCn (where n is a positive integer) which are coupled in series to each other, and a source select transistor SST.

A gate terminal of the drain select transistor DST included in each of the first to m-th cell strings CS1_1 to CS1_m is coupled to a drain select line DSL1. Gate terminals of the first to n-th memory cells MC1 to MCn included in each of the first to m-th cell strings CS1_1 to CS1_m are coupled to first to n-th word lines WL1 to WLn, respectively. A gate terminal of the source select transistor SST included in each of the first to m-th cell strings CS1_1 to CS1_m is coupled to a source select line SSL1.

For convenience of description, the structure of each cell string is described based on the first cell string CS1_1, among the plurality of cell strings CS1_1 to CS1_m. However, it will be understood that each of the remaining cell strings CS1_2 to CS1_m is configured in the same manner as the first cell string CS1_1.

A drain terminal of the drain select transistor DST included in the first cell string CS1_1 is coupled to the first bit line BL1. A source terminal of the drain select transistor DST included in the first cell string CS1_1 is coupled to a drain terminal of the first memory cell MC1 included in the first cell string CS1_1. The first to n-th memory cells MC1 to MCn may be coupled in series to each other. A drain terminal of the source select transistor SST included in the first cell string CS1_1 is coupled to a source terminal of the n-th memory cell MCn included in the first cell string CS1_1. A source terminal of the source select transistor SST included in the first cell string CS1_1 is coupled to a common source line CSL. In an embodiment, the common source line CSL may be coupled in common to the first to z-th memory blocks BLK1 to BLKz.

The drain select line DSL1, the first to n-th word lines WL1 to WLn, and the source select line SSL1 are included in the row lines RL of FIG. 2. The drain select line DSL1, the first to n-th word lines WL1 to WLn, and the source select line SSL1 are controlled by the address decoder 421. The common source line CSL is controlled by the control logic 430. The first to m-th bit lines BL1 to BLm are controlled by the read and write circuit 423.

Figure 6:
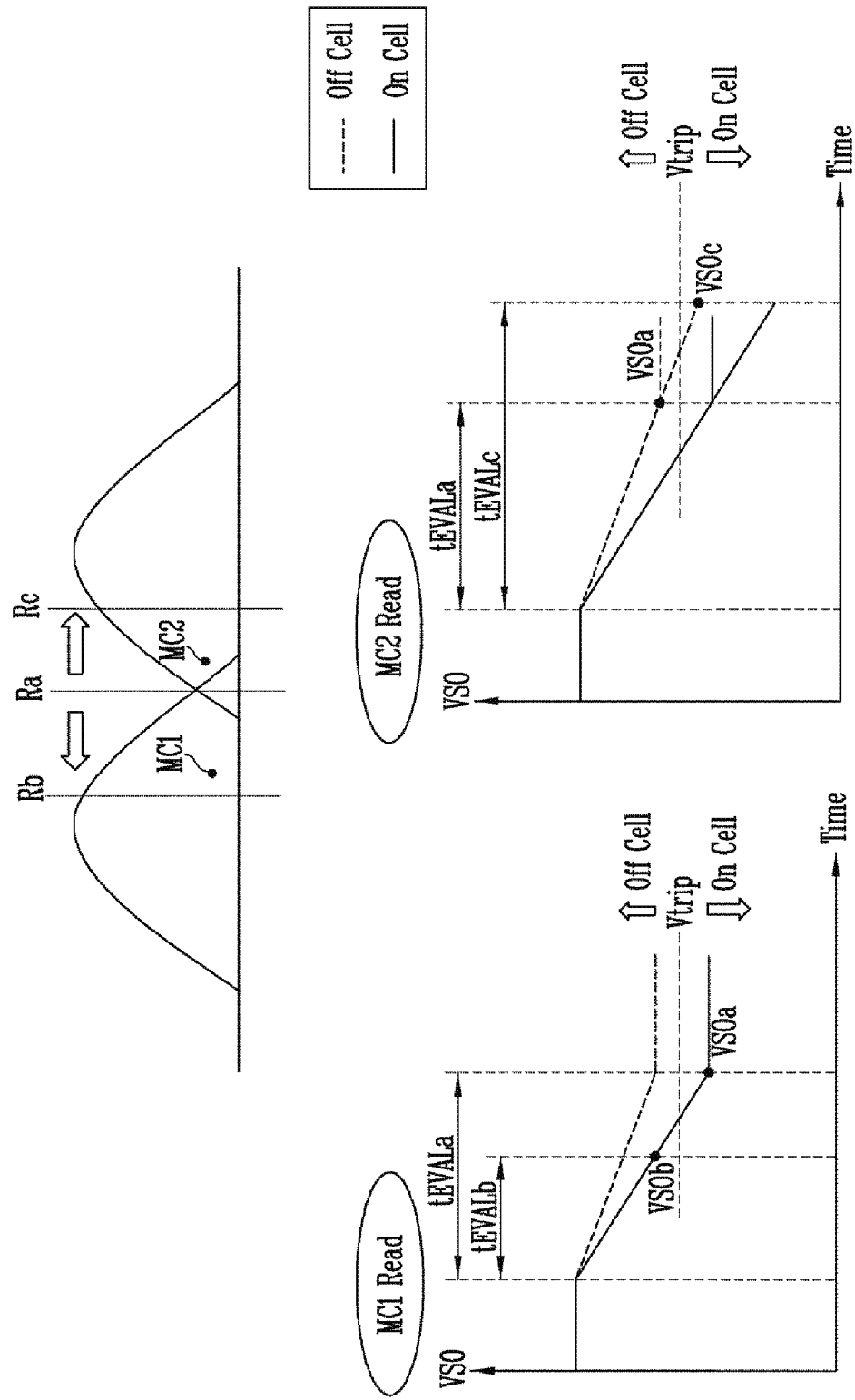
FIG. 6 is a diagram for describing a change in a soft read voltage depending on the length of a period during which an evaluation signal is activated.

FIG. 6 is a diagram for describing a change in a soft read voltage depending on the length of a period during which an evaluation signal is activated.

Referring to FIG. 6, a first read voltage Ra may be a read voltage for reading selected memory cells MC1 and MC2. A second read voltage Rb may be lower than the first read voltage Ra. A third read voltage Rc may be higher than the first read voltage Ra.

A first memory cell MC1 may be read as an on-cell using the first read voltage Ra. The first memory cell MC1 may be read as an off-cell using the second read voltage Rb. A second memory cell MC2 may be read as an off-cell using the first read voltage Ra. The second memory cell MC2 may be read as an on-cell using the third read voltage Rc.

A soft read operation may be an operation of reading selected memory cells using a plurality of soft read voltages.

In an embodiment, the soft read operation may be performed in such a way so as to apply the same read voltage to the selected word line coupled to the selected memory cells and set the lengths of evaluation periods in which an evaluation signal is activated to different lengths. The evaluation signal may be a signal for sensing the data stored in the memory cells.

In the case of the soft read operation according to an embodiment, the same read voltage is applied to the selected word line, but there can be acquired the same soft data as that obtained when the soft read operation is performed by physically applying a plurality of soft read voltages to the selected word line.

For example, during the soft read operation, the same first read voltage Ra may be applied to the selected word line coupled to the selected memory cells, and the lengths of the evaluation periods may be differently set. In this case, the same soft data as that obtained when the soft read operation is performed by applying the second and third read voltages Rb and Rc, which are different from each other, to the selected word line may be acquired.

In an embodiment, when the voltage VSO of a sensing node is higher than a reference voltage Vtrip, the corresponding selected memory cell may be read as an off-cell. When the voltage VSO of the sensing node is lower than the reference voltage Vtrip, the corresponding selected memory cell may be read as an on-cell. Depending on the length tEVAL of the evaluation period, the voltage VSO of the sensing node may be differently measured.

In FIG. 6, a first evaluation period corresponding to the first read voltage Ra may be tEVALa. A second evaluation period corresponding to the second read voltage Rb may be tEVALb. A third evaluation period corresponding to the third read voltage Rc may be tEVALc.

Because the second read voltage Rb is lower than the first read voltage Ra during a soft read operation on the first memory cell MC1, the evaluation periods may be set such that the second evaluation period tEVALb is shorter than the first evaluation period tEVALa.

The voltage of the sensing node measured depending on the first evaluation period tEVALa may be VSOa. Because VSOa is lower than the reference voltage Vtrip, the first memory cell MC1 may be read as an on-cell. The voltage of the sensing node measured depending on the second evaluation period tEVALb may be VSOb. Because VSOb is higher than the reference voltage Vtrip, the first memory cell MC1 may be read as an off-cell.

Because the third read voltage Rc is higher than the first read voltage Ra during a soft read operation on the second memory cell MC2, the evaluation periods may be set such that the third evaluation period tEVALc is longer than the first evaluation period tEVALa.

The voltage of the sensing node measured depending on the first evaluation period tEVALa may be VSOa. Because VSOa is higher than the reference voltage Vtrip, the first memory cell MC1 may be read as an off-cell. The voltage of the sensing node measured depending on the third evaluation period tEVALc may be VSOc. Because VSOc is lower than the reference voltage Vtrip, the second memory cell MC2 may be read as an on-cell.

In an embodiment, by adjusting the lengths of the evaluation periods, the memory device may acquire the same result as that obtained when a read operation is performed by applying different voltages to the corresponding word line. tEVALa may be a reference evaluation period during which the selected memory cell is to be sensed using the read voltage applied to the selected word line.

For example, the first memory cell MC1 may be read as an off-cell using the second read voltage Rb. That is, the result of applying the second read voltage Rb to the selected word line and reading the first memory cell MC1 depending on the reference evaluation period may be identical to the result of applying the first read voltage Ra to the selected word line and reading the first memory cell MC1 depending on the second evaluation period tEVALb.

The second memory cell MC2 may be read as an on-cell using the third read voltage Rc. That is, the result of applying the third read voltage Rc to the selected word line and reading the second memory cell MC2 depending on the reference evaluation period may be identical to the result of applying the first read voltage Ra to the selected word line and reading the second memory cell MC2 depending on the third evaluation period tEVALc.

Figure 7:
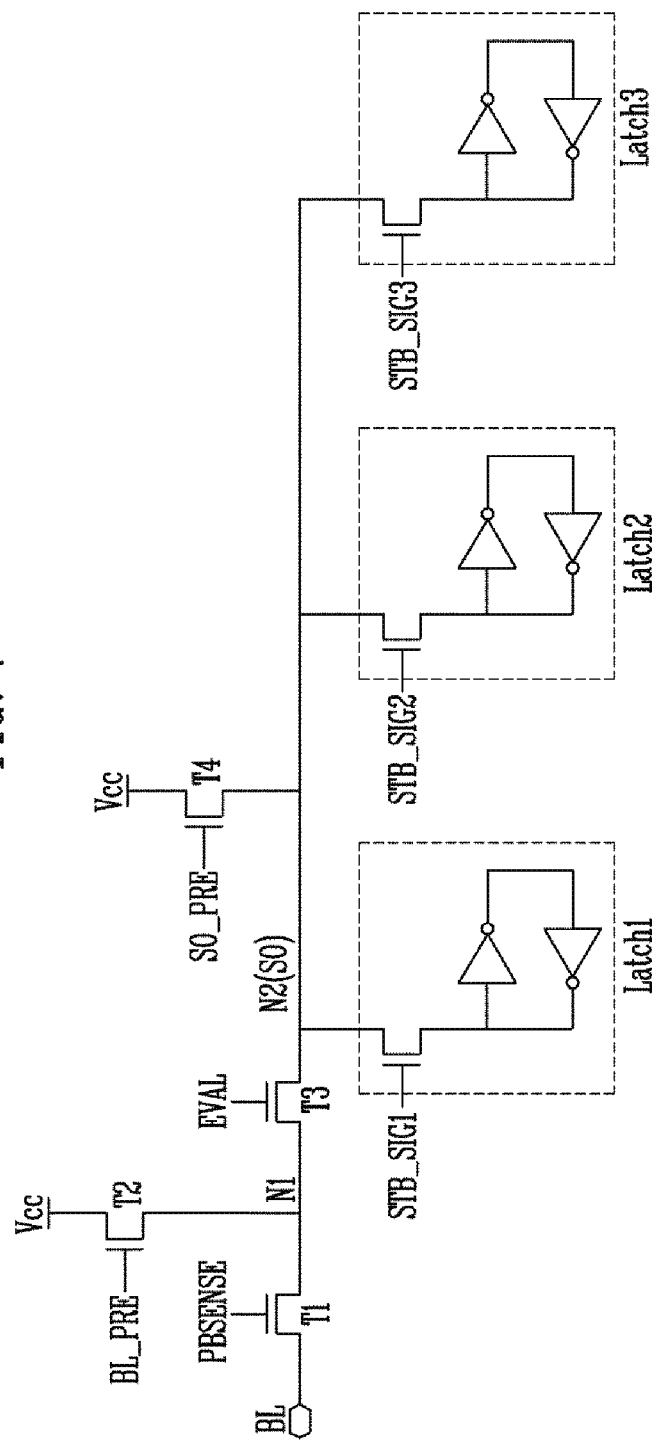
FIG. 7 is a diagram illustrating a page buffer of FIG. 4.

FIG. 7 is a diagram illustrating a page buffer included in the read and write circuit 423 of FIG. 4.

Referring to FIG. 7, the page buffer may include a plurality of latches. The number of latches included in the page buffer is not limited to the illustrated embodiment.

A selected memory cell may be coupled to the page buffer through a bit line BL. A first switch T1 may be coupled between the bit line BL and a first node N1. The first switch T1 may be turned on or off in response to a page buffer control signal PBSENSE. The first switch T1 may transfer the potential of the first node N1 to the bit line BL in response to the page buffer control signal PBSENSE.

A second switch T2 may be coupled between a node of a supply voltage Vcc and the first node N1. The second switch T2 may be turned on or off in response to a bit line precharge signal BL_PRE. The second switch T2 may perform precharging by applying the supply voltage Vcc to the first node N1 in response to the bit line precharge signal BL_PRE.

A third switch T3 may be coupled between the first node N1 and a second node N2, which is a sensing node SO. The third switch T3 may be turned on or off in response to an evaluation signal EVAL. The third switch T3 may transfer the potential of the first node N1 to the sensing node SO in response to the evaluation signal EVAL.

The fourth switch T4 may be coupled between the node of the supply voltage Vcc and the sensing node SO. The fourth switch T4 may be turned on or off in response to a sensing node precharge signal SO_PRE. The fourth switch T4 may perform precharging by applying the supply voltage Vcc to the sensing node SO in response to the sensing node precharge signal SO_PRE. First to third latches Latch1 to Latch3 may be coupled to the sensing node SO. The first to third latches Latch1 to Latch3 may sense and store pieces of data stored in the selected memory cell in response to first to third strobe signals STB_SIG1 to SIG3 respectively corresponding thereto. In detail, the first to third latches Latch1 to Latch3 may store pieces of data determined according to the potential of the sensing node SO in response to the first to third strobe signals STB_SIG1 to SIG3, respectively.

Assuming that a selected memory cell is a single-level cell which stores one data bit, the data stored in the selected memory cell may be '0' or '1' depending on whether the selected memory cell is an on-cell or an off-cell. For example, when the selected memory cell is read as an on-cell using the read voltage, the data stored in the selected memory cell may be '1'. For example, when the selected memory cell is read as an off-cell using the read voltage, the data stored in the selected memory cell may be '0'.

In various embodiments, when the selected memory cell stores a plurality of data bits, data stored in the selected memory cell may be determined depending on whether the selected memory cell is read as an on-cell or an off-cell using each of the plurality of read voltages. For example, when the memory cell stores two data bits, the memory cell may be programmed to any one of an erased state and first to third programmed states. The memory cell may store pieces of data corresponding to respective states. Pieces of data corresponding to the erased state and the first to third programmed states may be '01', '00', '10', and '11'.

The first to third read voltages may be read voltages for distinguishing two adjacent states, among a plurality of states of the corresponding memory cell, from each other. The first read voltage may be a read voltage for distinguishing the erased state from the first programmed state. The second read voltage may be a read voltage for distinguishing the first programmed state from the second programmed state. The third read voltage may be a read voltage for distinguishing the second programmed state from the third programmed state.

Because a memory cell that is read as an on-cell using the first read voltage has an erased state, the data stored in the memory cell may be '01'. Because a memory cell that is read as an off-cell using the first read voltage and that is read as an on-cell using the second read voltage has a first programmed state, the data stored in the memory cell may be '00'. Because the memory cell that is read as an off-cell using the second read voltage and that is read as an on-cell using the third read voltage has a second programmed state, the data stored in the memory cell may be '10'. Because a memory cell that is read as an off-cell using the third read voltage has a third programmed state, the data stored in the memory cell may be '11'.

Before the data stored in the selected memory cell is sensed, a bit line precharge operation may be performed. When the page buffer control signal PBSENSE and the bit line precharge signal BL_PRE are activated, the bit line BL may be precharged while the supply voltage Vcc is transferred to the bit line BL. Thereafter, a bit line sensing operation may be performed. When a drain select transistor DST, described above with reference to FIG. 5, is turned on, current may flow from the bit line BL to a cell string while the bit line BL is coupled to the cell string. The amount of current flowing through the bit line BL may change depending on whether the selected memory cell is read as an on-cell or an off-cell using the read voltage. When the selected memory cell is an on-cell, a large amount of current flows through the bit line BL, whereas when the selected memory cell is an off-cell, a small amount of current may flow through the bit line BL.

After the bit line sensing operation has been performed, a sensing node precharge operation and a sensing node sensing operation may be performed. The sensing node precharge operation may be an operation of precharging the sensing node SO in response to the sensing node precharge signal SO_PRE. The sensing node sensing operation may be an operation of sensing the potential of the sensing node SO in response to the evaluation signal EVAL. When the evaluation signal EVAL is activated, the first node N1 is coupled to the sensing node SO, and the potential of the sensing node SO may drop. A range in which the potential of the sensing node SO drops may be determined according to the amount of current flowing through the bit line BL. When the amount of current flowing through the bit line BL is large, the range of a drop in the potential of the sensing node SO may be wider, whereas when the amount of current flowing through the bit line BL is small, the range of a drop in the potential of the sensing node SO may be narrower.

Further, the potential of the sensing node SO may be determined differently depending on not only the amount of current flowing through the bit line BL but also the length of the evaluation period in which the evaluation signal EVAL is activated. As the evaluation period is longer, the range of a drop in the potential of the sensing node SO may be wider, whereas as the evaluation period is shorter, the range of a drop in the potential of the sensing node SO may be narrower. The reason for this is that, as the evaluation period is longer, a larger amount of current flows from the sensing node SO into the bit line BL.

Depending on whether the selected memory cell is an on-cell or an off-cell using the read voltage, the potential of the sensing node SO may be determined to be a high level or a low level after the sensing node sensing operation has been performed.

In an embodiment, during a soft read operation, a bit line sensing operation may be performed once, and a sensing node sensing operation may be performed several times. The reason for this is that it takes a long time to perform the bit line precharge operation for performing the bit line sensing operation, whereas it takes a relatively short time to perform the sensing node precharge operation for performing the sensing node sensing operation.

In detail, because the bit line BL is coupled to a cell string including a large number of memory cells, and the sensing node SO is coupled to some switches and latches, the capacitance value of the bit line BL may be greater than that of the sensing node SO. Therefore, the time required to precharge the bit line BL having a large capacitance value may be longer than the time required to precharge the sensing node SO having a small capacitance value.

Further, because the capacitance value of the bit line BL is much larger than that of the sensing node SO, the range of a change in the potential of the bit line BL may be much narrower than that of the sensing node SO even if the same amount of current flows out to the cell string.

The latch may sense and store the data stored in the selected memory cell depending on the potential of the sensing node SO. In detail, the latch may latch the data, determined according to the potential of the sensing node SO which is sensed during the evaluation period, in response to a strobe signal.

For example, when the potential of the sensing node SO is at a high level, which is higher than that of the reference voltage Vtrip, the latch may store the result of reading the selected memory cell as an off-cell. In the case of a single-level cell, the latch may store data '0'. When the potential of the sensing node SO is at a low level, which is lower than that of the reference voltage Vtrip, the latch may store the result of reading the selected memory cell as an on-cell. In the case of a single-level cell, the latch may store data '1'.

Figure 8:
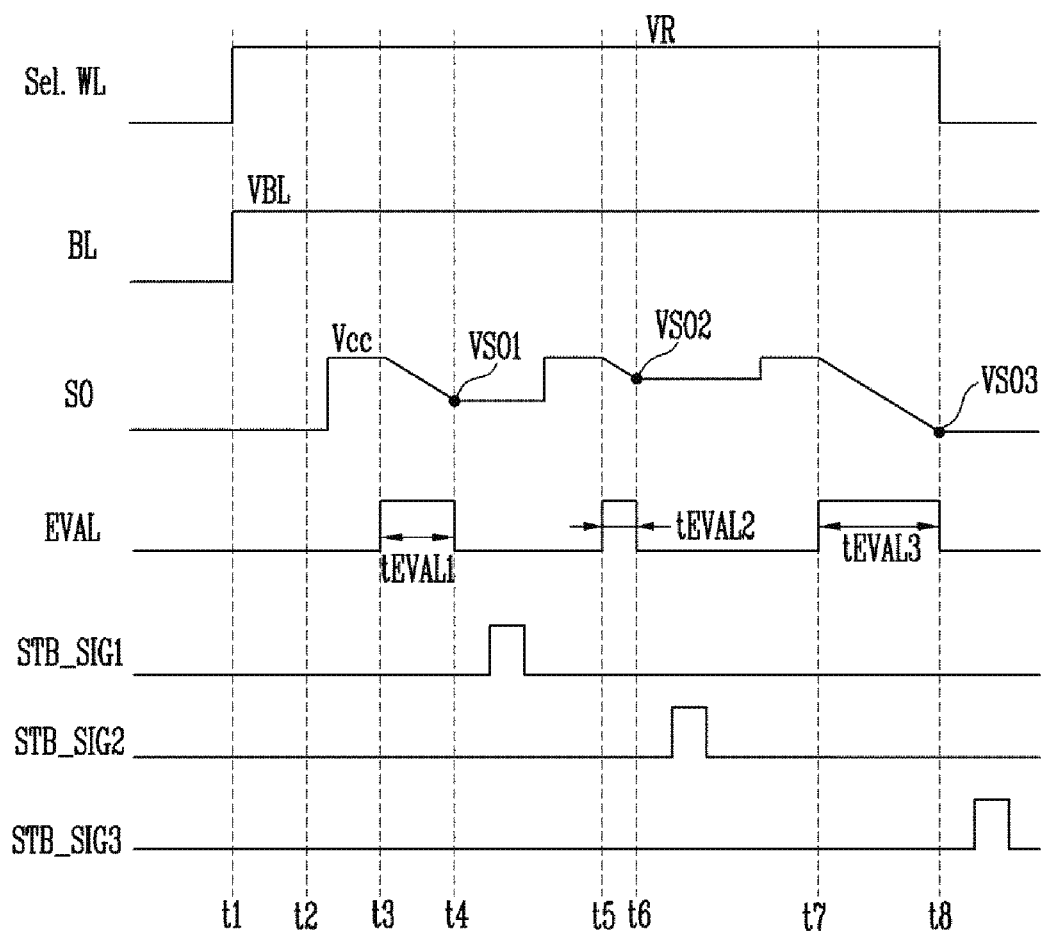
FIG. 8 is a timing diagram for describing a soft read operation according to an embodiment of the present disclosure.

FIG. 8 is a timing diagram for describing a soft read operation according to an embodiment.

Referring to FIG. 8, during a period from a time t1 to a time t9, a soft read operation may be performed.

During the period from the time t1 to the time t9, a read voltage VR may be applied to a selected word line Sel. WL coupled to a selected memory cell.

Before the time t1, a bit line precharge operation for a bit line sensing operation may be performed. Depending on the bit line precharge operation, the potential of the bit line BL may be precharged to a bit line voltage VBL.

During a period from the time t1 to a time t2, the bit line sensing operation may be performed. When the bit line sensing operation is performed, a bit line current may flow from the bit line BL into a cell string including the selected memory cell. The amount of bit line current may change depending on whether the selected memory cell is an on-cell or an off-cell. When the selected memory cell is an on-cell, the amount of bit line current may be large, whereas when the selected memory cell is an off-cell, the amount of bit line current may be small.

When the bit line current flows, the potential of the bit line BL and the potential of the sensing node SO coupled to the bit line BL may vary. However, because the capacitance value of the bit line BL is much larger than that of the sensing node SO, the range of the change in the potential of the bit line BL depending on the same bit line current amount may be insignificant compared to the range of the change in the potential of the sensing node SO.

After the time t2, a sensing node sensing operation may be repeatedly performed in accordance with an evaluation period tEVAL in which an evaluation signal EVAL is activated. The sensing node sensing operation may be an operation of sensing the changed potential of the sensing node SO depending on the amount of current flowing through the bit line BL during the evaluation period tEVAL. Before the sensing node sensing operation, a sensing node precharge operation of applying the supply voltage Vcc to the sensing node SO and precharging the sensing node SO may be performed.

During a first evaluation period tEVAL1 from a time t3 to a time t4, a first sensing node sensing operation may be performed. During the first evaluation period tEVAL1, the potential of the sensing node SO may change from the supply voltage Vcc to a voltage VSO1. The first latch may store data determined according to the potential of the sensing node SO in response to a first strobe signal STB_STG1. In detail, the first latch may store data '0' or '1' that is determined based on the result of a comparison between the sensed potential VSO1 of the sensing node SO and the reference voltage Vtrip in response to the period during which the first strobe signal STB_SIG1 is activated.

During a second evaluation period tEVAL2 from a time t5 to a time t6, a second sensing node sensing operation may be performed. During the second evaluation period tEVAL2, the potential of the sensing node SO may change from the supply voltage Vcc to a voltage VSO2. The second latch may store data determined according to the potential of the sensing node SO in response to a second strobe signal STB_STG2. In detail, the first latch may store data '0' or '1' that is determined based on the result of a comparison between the sensed potential VSO2 of the sensing node SO and the reference voltage Vtrip in response to the period during which the second strobe signal STB_SIG2 is activated.

During a third evaluation period tEVAL3 from a time t7 to a time t8, a third sensing node sensing operation may be performed. During the third evaluation period tEVAL3, the potential of the sensing node SO may change from the supply voltage Vcc to a voltage VSO3. The third latch may store data determined according to the potential of the sensing node SO in response to a third strobe signal STB_STG3. In detail, the third latch may store data '0' or '1' that is determined based on the result of a comparison between the sensed potential VSO3 of the sensing node SO and the reference voltage Vtrip in response to the period during which the third strobe signal STB_SIG3 is activated.

Because the sensed potential of the sensing node differs according to the length of the evaluation period tEVAL, the same effect as that obtained when the corresponding memory cell is read using multi-level soft read voltages may be obtained even if the same voltage is applied to the selected word line, as described above with reference to FIG. 6.

Referring to FIG. 5, because the bit line BL is coupled to a cell string including a large number of memory cells, it may take a long time to perform a bit line precharge operation for a bit line sensing operation. Referring to FIG. 7, because the sensing node SO is coupled to a relatively small number of latches, a sensing node precharge operation for a sensing node sensing operation may require a shorter time than that of the bit line precharge operation.

Therefore, the soft read operation may be performed in such a way so as to perform the bit line sensing operation only once and perform the sensing node sensing operation several times in accordance with the evaluation periods since the bit line sensing operation.

Figure 9:
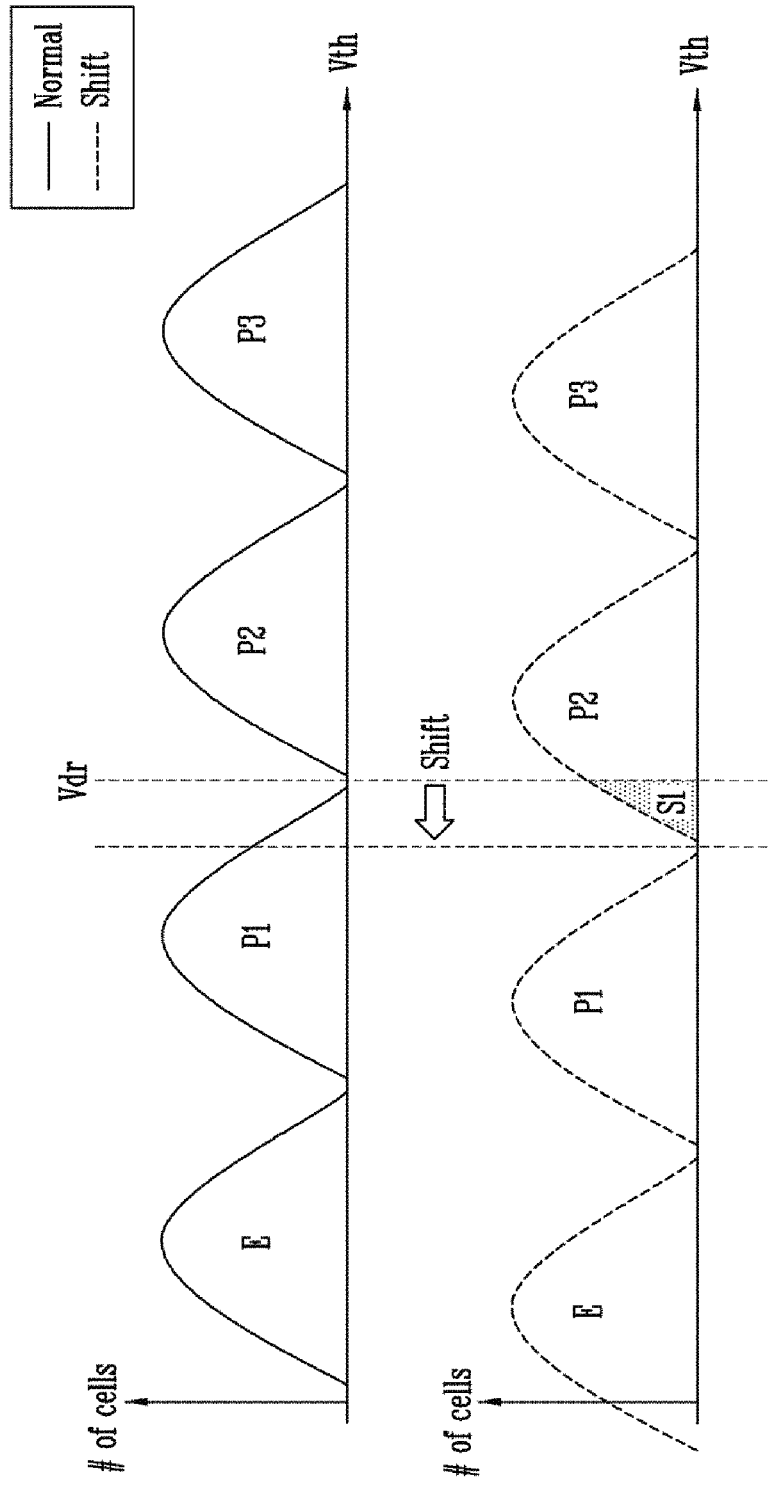
FIG. 9 is a diagram for describing a shift value according to an embodiment of the present disclosure.

FIG. 9 is a diagram for describing a shift value according to an embodiment.

Referring to FIG. 9, selected memory cells may be multi-level cells which store two data bits. However, the number of data bits stored in each selected memory cell is not limited to two bits.

A shift value may indicate an extent to which threshold voltage distributions of selected memory cells are shifted from a normal distribution.

The shift value may be the difference between the number of memory cells read as on-cells using a read voltage Vdr, among the selected memory cells, and the reference number of memory cells. The reference number of memory cells may be determined based on the number of selected memory cells and the number of data bits stored in the selected memory cells.

For example, the number of selected memory cells may be 400, and the number of data bits stored in each of the selected memory cells may be 2. In this case, because each selected memory cell is a multi-level cell, the selected memory cell may be programmed to any one of first to fourth states E and P1 to P3. Therefore, the number of memory cells belonging to each state may be predicted to be 100.

That is, the reference number of memory cells may be the number of memory cells read as on-cells using the read voltage Vdr, among selected memory cells having a normal distribution. In other words, the reference number of memory cells corresponding to the read voltage Vdr may be determined to be 200 indicating the number of memory cells having first and second states E and P1.

For example, the number of memory cells that are read as on-cells using the read voltage Vdr, among selected memory cells having a shifted threshold voltage distribution (shift), may be 255. The shift value may be 25 obtained by subtracting 200 from 225. This may be the number of memory cells in region S1.

In other words, as the shift value is larger, the number of memory cells in the region S1 is larger, which means that the extent to which the threshold voltage distribution is shifted is large. That is, it may be determined that, as the shift value is larger, the threshold voltage distribution deviates more from the normal distribution. In contrast, as the shift value is smaller, the number of memory cells in region S1 is small, which means that the extent to which the threshold voltage distribution is shifted is small. That is, it may be determined that, as the shift value is smaller, the threshold voltage distribution deviates less from the normal distribution.

Although a case where the threshold voltage distribution is shifted to the left is illustrated in FIG. 9, a case where the threshold voltage distribution is shifted to the right may also be described in the same manner.

Figures 10, 11A:
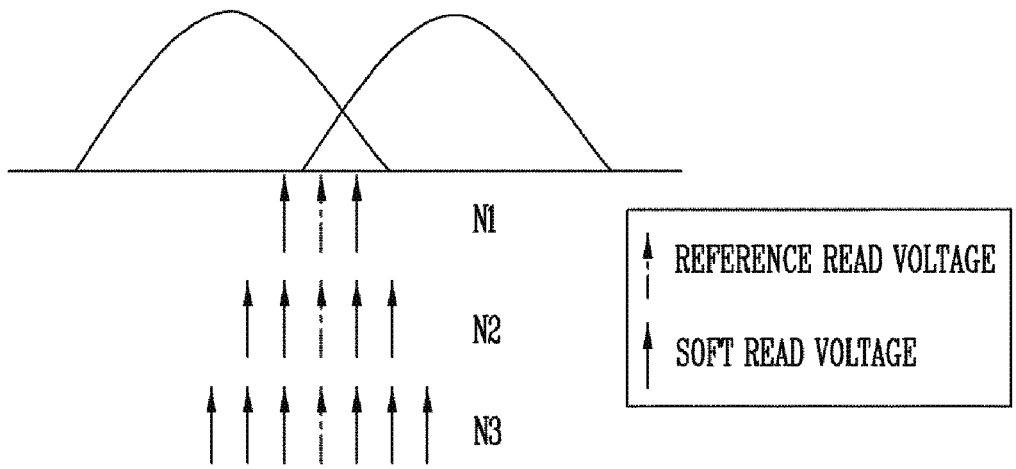
FIG. 10 is a diagram for describing a shift level depending on the shift value of FIG. 9.
FIG. 11A is a diagram illustrating a first embodiment for determining soft read voltages based on the shift level.

FIG. 10 is a diagram for describing a shift level depending on the shift value of FIG. 9.

Referring to FIG. 10, the shift level may indicate an extent to which a threshold voltage distribution is shifted from a normal distribution and which is determined based on the results of a comparison between a shift value x and a plurality of reference values Ref.

The plurality of shift levels may correspond to a plurality of reference periods. The plurality of reference periods may be determined based on the plurality of reference values. The number of shift levels is not limited to the present embodiment.

For example, a first shift level S_L1 may correspond to a first reference period. The first reference period may be determined based on first and second reference values Ref1 and Ref2. A second shift level S_L2 may correspond to a second reference period. The second reference period may be determined based on second and third reference values Ref2 and Ref3. A third shift level S_L3 may correspond to a third reference period. The third reference period may be determined based on third and fourth reference values Ref3 and Ref4.

The shift level may be determined to be a shift level corresponding to the period to which the shift value x belongs, among a plurality of reference periods. That is, it may be determined that, as the shift level is higher, a threshold voltage distribution deviates more from the normal distribution. It may be determined that, as the shift level is lower, a threshold voltage distribution deviates less from the normal distribution.

FIG. 11A is a diagram illustrating a first embodiment for determining soft read voltages based on the shift level.

Referring to FIG. 11A, the number of soft read voltages may be determined depending on the shift level.

The soft read voltages may be distributed horizontally with respect to a reference read voltage. Here, the interval between the soft read voltages may be uniform. The reference read voltage may be a default read voltage for distinguishing two adjacent states, among a plurality of states of the selected memory cells, from each other.

As the shift level is higher, the state of the threshold voltage distribution deviates more from the normal distribution, and thus a large amount of soft data may be required for error correction decoding on the read data. That is, as the shift level is higher, the number of soft read voltages required for the soft read operation may increase so as to acquire a larger amount of soft data.

For example, when the shift level is a first shift level S_L1, the number of soft read voltages required for the soft read operation may be N1 (where N1 is a natural number of 2 or more). When the shift level is a second shift level S_L2, the number of soft read voltages may be N2 (where N2 is a natural number equal to or greater than N1). When the shift level is a third shift level S_L3, the number of soft read voltages may be N3 (where N3 is a natural number equal to or greater than N2).

As described above with reference to FIG. 8, as the number of soft read voltages increases, the number of evaluation periods corresponding to the soft read voltages may also increase. That is, when the shift level is the first shift level S_L1, the number of evaluation periods in the soft read operation may be N1. When the shift level is the second shift level S_L2, the number of evaluation periods may be N2. When the shift level is the third shift level S_L3, the number of evaluation periods may be N3.

Figure 11B:
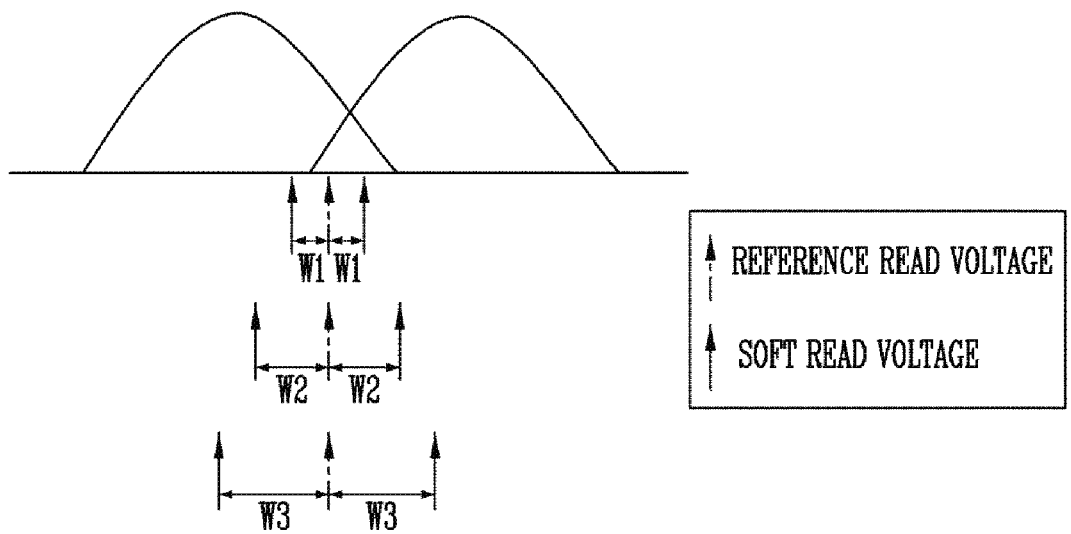
FIG. 11B is a diagram illustrating a second embodiment for determining soft read voltages based on the shift level.

FIG. 11B is a diagram illustrating a second embodiment for determining soft read voltages based on the shift level.

Referring to FIG. 11B, an interval between soft read voltages may be determined depending on the shift level.

The soft read voltages may be distributed horizontally with respect to a reference read voltage. Here, the number of soft read voltages may be uniform.

As the shift level is higher, the state of a threshold voltage distribution deviates more from a normal distribution, and thus meaningful soft data may be required for error correction decoding on the read data. That is, as the shift level is higher, the interval between soft read voltages may increase so as to acquire meaningful soft data.

For example, when the shift level is a first shift level S_L1, the interval between the soft read voltages may be W1. When the shift level is a second shift level S_L2, the interval between the soft read voltages may be W2. When the shift level is a third shift level S_L3, the interval between the soft read voltages may be W3. In an embodiment, W2 may be equal to or greater than W1. W3 may be equal to or greater than W2.

As described above with reference to FIG. 8, as the interval between the soft read voltages increases, the difference between the lengths of evaluation periods may increase. That is, when the shift level is the first shift level S_L1, the difference between the lengths of evaluation periods may be D1. When the shift level is the second shift level S_L2, the difference between the lengths of evaluation periods may be may be D2. When the shift level is the third shift level S_L3, the difference between the lengths of evaluation periods may be may be D3. In an embodiment, D2 may be equal to or greater than D1. D3 may be equal to or greater than D2.

Figure 11C:
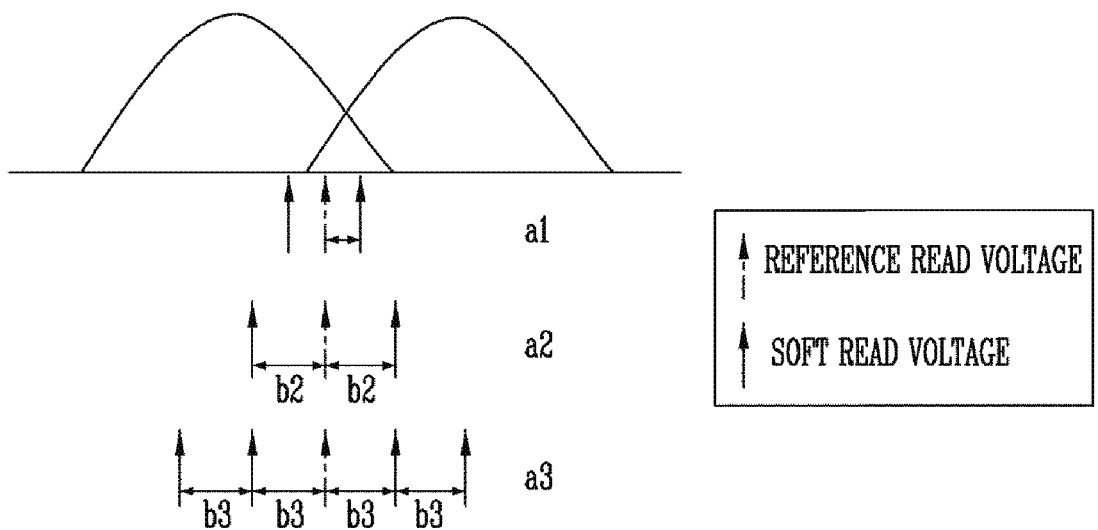
FIG. 11C is a diagram illustrating a third embodiment for determining soft read voltages based on the shift level.

FIG. 11C is a diagram illustrating a third embodiment for determining soft read voltages based on the shift level.

Referring to FIG. 11C, the number of soft read voltages and the interval between soft read voltages may be determined depending on the shift level.

As the shift level is higher, the number of soft read voltages and the interval between soft read voltages may increase.

For example, when the shift level is a first shift level S_L1, the number of soft read voltages may be a1, and the interval between the soft read voltages may be b1. For example, when the shift level is a second shift level S_L2, the number of soft read voltages may be a2, and the interval between the soft read voltages may be b2. For example, when the shift level is a third shift level S_L3, the number of soft read voltages may be a3, and the interval between the soft read voltages may be b3.

In the numbers of soft read voltages, a1a2a3 may be satisfied. In the intervals between the soft read voltages, 131b2b3 may be satisfied. Based on the number of soft read voltages and the interval between the soft read voltages determined depending on the shift level, the number of evaluation periods and the lengths of the evaluation periods may be set. In other words, the number of evaluation periods and the lengths of the evaluation periods may be set depending on the shift level.

Figure 12:
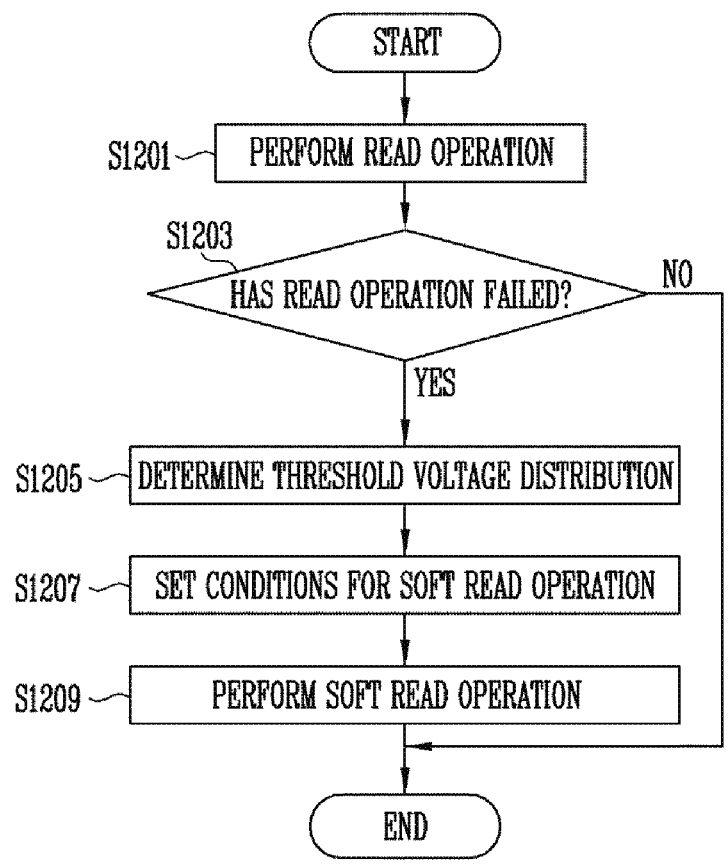
FIG. 12 is a flowchart illustrating a soft read operation according to an embodiment of the present disclosure.

FIG. 12 is a flowchart illustrating a soft read operation according to an embodiment.

Referring to FIG. 12, at step S1201, a memory device may perform a read operation on selected memory cells. The memory device may provide read data acquired through the read operation to a memory controller.

At step S1203, the memory controller may determine, based on the read data, whether the read operation has failed. In detail, the memory controller may determine, based on the result of performing error correction decoding on the read data, whether the read operation has passed or failed.

When it is determined that the read operation has failed (in case of Yes), the process proceeds to step S1205. When it is determined that the read operation has passed (in case of No), the process is terminated.

At step S1205, in a first embodiment, the memory controller may determine, based on the result of performing error correction decoding, an extent to which the threshold voltage distribution of selected memory cells deviates from a normal distribution. In detail, the memory controller may compare the normal distribution with the threshold voltage distribution of the selected memory cells, and may determine the extent to which the threshold voltage distribution of the selected memory cells is shifted from the normal distribution.

In a second embodiment, the memory device may determine, based on the read data, the extent to which the threshold voltage distribution of the memory cells deviates from the normal distribution. Similarly, the memory device may also determine the extent to which the threshold voltage distribution of the selected memory cells is shifted from the normal distribution.

At step S1207, the memory device may acquire information indicating the extent to which the threshold voltage distribution of the selected memory cells deviates from the normal distribution from the memory controller. Alternatively, the memory device may autonomously generate information indicating the extent to which the threshold voltage distribution of the selected memory cells deviates from the normal distribution.

The memory device may set the conditions for a soft read operation based on the information indicating the extent to which the threshold voltage distribution of the selected memory cells deviates from the normal distribution. The conditions for the soft read operation may include the number of soft read voltages and the interval between the soft read voltages which correspond to the soft read operation.

At step S1209, a soft read operation may be performed based on the set soft read operation conditions. In detail, the memory device may apply the read voltage to a selected word line coupled to the selected memory cells, and may control the number of evaluation periods or the lengths of evaluation periods.

Figure 13:
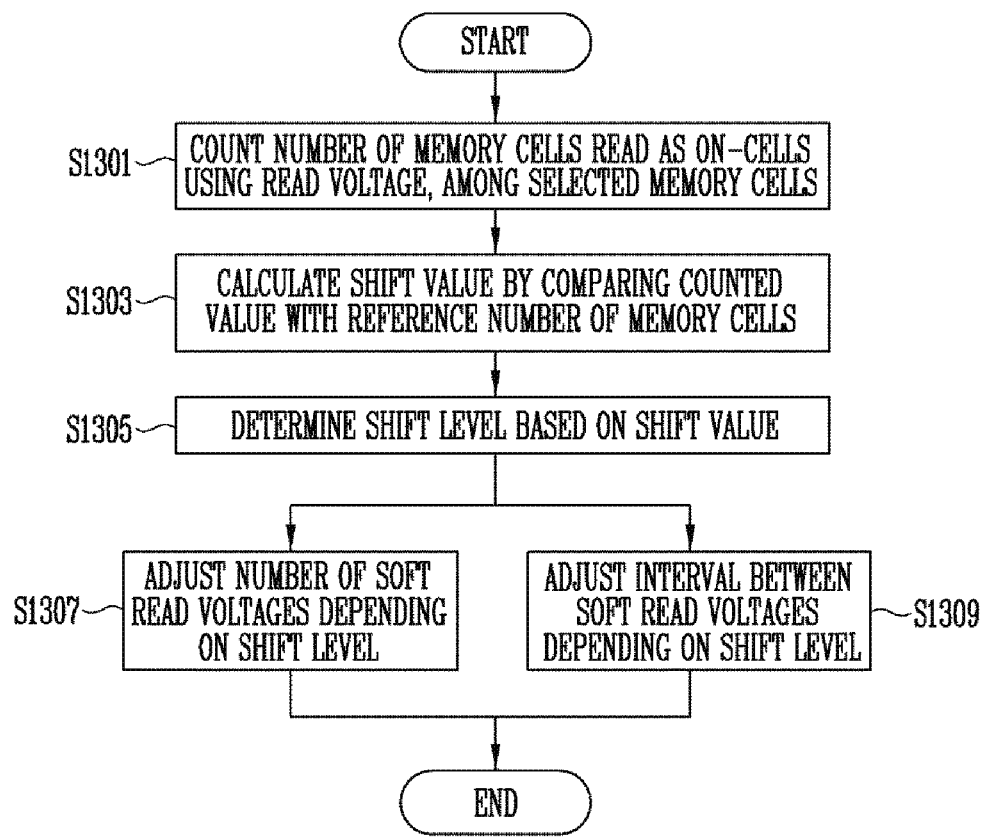
FIG. 13 is a flowchart illustrating in detail the soft read operation of FIG. 12.

FIG. 13 is a flowchart illustrating in detail the soft read operation of FIG. 12.

Referring to FIG. 13, steps S1205 and S1207 of FIG. 12 are described in detail.

At step S1301, the number of memory cells that are read as on-cells using a read voltage, among the selected memory cells, may be counted.

At step S1303, a shift value indicating the difference between the counted number and the reference number of memory cells may be calculated. The reference number of memory cells may be determined based on the number of selected memory cells and the number of data bits stored in the selected memory cells.

At step S1305, a shift level may be determined based on the shift value. The shift level may indicate an extent to which the threshold voltage distribution of the selected memory cells is shifted from a normal distribution. The number of soft read voltages for reading the selected memory cells or the interval between the soft read voltages may be determined depending on the shift level.

At step S1307, the number of soft read voltages may be adjusted depending on the determined shift level. As the shift level is higher, the number of soft read voltages may increase.

At step S1309, the interval between the soft read voltages may be adjusted depending on the determined shift level. As the shift level is higher, the interval between the soft read voltages may increase.

Steps S1307 and S1309 may be independently performed. In other words, either or both of steps S1307 and S1309 may be performed.

In accordance with the present disclosure, there are provided a storage device having improved read performance and a method of operating the storage device.

What is claimed is:
1. A memory device, comprising:
a memory cell array including a plurality of memory cells;
a read operator configured to apply a read voltage to a selected word line coupled to selected memory cells among the plurality of memory cells and configured to read the selected memory cells in response to an evaluation signal for sensing data stored in the selected memory cells;

a shift level determiner configured to calculate a shift value indicating a difference between a number of memory cells that are read as on-cells using the read voltage, among the selected memory cells, and a reference number of memory cells and configured to determine a shift level of a threshold voltage distribution for the selected memory cells based on the shift value;

a soft read table storage configured to store soft read set parameters respectively corresponding to a plurality of shift levels; and a read operation controller configured to determine a plurality of soft read voltages based on the shift level and the soft read set parameters and configured to control the read operator in response to the evaluation signal so that a soft read operation of reading the selected memory cells using the plurality of determined soft read voltages is performed.

2. The memory device according to claim 1, wherein the shift level determiner is configured to determine the shift level based on a reference period to which the shift value belongs, among a plurality of reference periods respectively corresponding to the plurality of shift levels.

3. The memory device according to claim 1, wherein the soft read set parameters include information about a number of the soft read voltages respectively corresponding to the plurality of shift levels.

4. The memory device according to claim 3, wherein a number of soft read voltages corresponding to a second shift level higher than a first shift level, among the plurality of shift levels, is equal to or greater than a number of soft read voltages corresponding to the first shift level.

5. The memory device according to claim 1, wherein the soft read set parameters include information about an interval between the plurality of soft read voltages respectively corresponding to the plurality of shift levels.

6. The memory device according to claim 5, wherein an interval between a plurality of soft read voltages corresponding to a fourth shift level higher than a third shift level, among the plurality of shift levels, is equal to or wider than an interval between a plurality of soft read voltages corresponding to the third shift level.

7. The memory device according to claim 1, wherein the read operator applies the read voltage to the selected word line and performs the soft read operation in response to evaluation periods during which the evaluation signal is activated.

8. The memory device according to claim 7, wherein the read operation controller is configured to adjust a number of the evaluation periods depending on a number of the soft read voltages.

9. The memory device according to claim 7, wherein the read operation controller is configured to adjust lengths of the evaluation periods depending on an interval between the plurality of soft read voltages.

10. The memory device according to claim 9, wherein:
the read operation controller is configured to set the lengths of the evaluation periods so that, among the evaluation periods, a second evaluation period is longer than a first evaluation period,
the first evaluation period corresponds to a first soft read voltage, among the plurality of soft read voltages, and the second evaluation period corresponds to a second soft read voltage higher than the first soft read voltage.

11. The memory device according to claim 9, wherein:
the read operation controller is configured to set the lengths of the evaluation periods so that, among the evaluation periods, a fourth evaluation period is shorter than a third evaluation period,
the third evaluation period corresponds to a third soft read voltage, among the plurality of soft read voltages, and
the fourth evaluation period corresponds to a fourth soft read voltage lower than the third soft read voltage.

12. The memory device according to claim 1, wherein the read operation controller is configured to, when a soft read command is received, control the read operator so that the soft read operation is performed.

13. The memory device according to claim 1, wherein the reference number of memory cells is determined based on a number of the selected memory cells and a number of data bits stored in the selected memory cells.

14. A storage device, comprising:
a memory device including a plurality of memory cells; and
a memory controller configured to, when a read operation of reading selected memory cells among the plurality of memory cells using a read voltage fails, calculate a shift value indicating a difference between a number of memory cells read as on-cells using the read voltage, among the selected memory cells, and a reference number of memory cells, and configured to provide the memory device with the shift value and a soft read command of indicating a soft read operation for the selected memory cells,
wherein the memory device is configured to determine a shift level of a threshold voltage distribution for the selected memory cells based on the shift value in response to the soft read command and configured to perform the soft read operation of reading the selected memory cells using a plurality of soft read voltages determined based on the shift level.

15. The storage device according to claim 14, wherein the memory controller comprises:
an error corrector configured to receive read data for the read operation from the memory device, perform error correction decoding on the read data, and generate error correction decoding information indicating whether the read operation has passed or failed; and
a command controller configured to determine, based on the error correction decoding information, whether the read operation has failed, and configured to provide the soft read command to the memory device when the read operation has failed.

16. The storage device according to claim 15, wherein:
the command controller is configured to calculate the shift value based on the error correction decoding information and provide the shift value to the memory device, and
the reference number of memory cells is determined based on a number of the selected memory cells and a number of data bits stored in the selected memory cells.

17. The storage device according to claim 14, wherein the memory device is configured to apply the read voltage to a selected word line coupled to the selected memory cells and configured to perform the soft read operation in response to an evaluation signal for sensing data stored in the selected memory cells.

18. The storage device according to claim 17, wherein the memory device is configured to control evaluation periods during which the evaluation signal is activated depending on a plurality of soft read voltages determined based on the shift level.

19. The storage device according to claim 18, wherein the memory device is configured to adjust a number of the evaluation periods depending on the shift level.

20. The storage device according to claim 18, wherein the memory device is configured to adjust lengths of evaluation periods depending on the shift level.

* * * * *